US006545395B2

United States Patent
Matsui et al.

(10) Patent No.: US 6,545,395 B2
(45) Date of Patent: Apr. 8, 2003

(54) PIEZOELECTRIC CONVERSION ELEMENT HAVING AN ELECTRODED SURFACE WITH A NON-ELECTRODE SURFACE PORTION AT AN END THEREOF

(75) Inventors: Naoki Matsui, Sakai (JP); Hiroji Katsuragi, Izumi (JP)

(73) Assignee: Minolta Co., Ltd., Osaka (JP)

(*) Notice: Subject to any disclaimer, the term of this patent is extended or adjusted under 35 U.S.C. 154(b) by 0 days.

(21) Appl. No.: 09/773,591

(22) Filed: Feb. 2, 2001

(65) Prior Publication Data
US 2001/0015597 A1 Aug. 23, 2001

(30) Foreign Application Priority Data

Feb. 17, 2000 (JP) ........................................ 2000-038993

(51) Int. Cl.⁷ .................... H01L 41/04; H01L 41/08; H01L 41/18; H02N 2/00
(52) U.S. Cl. ..................... 310/369; 310/330; 310/364; 310/365
(58) Field of Search ................. 310/369, 328, 310/348, 317, 323.14, 330, 364, 365, 366; 29/25.35

(56) References Cited

U.S. PATENT DOCUMENTS

| | | | |
|---|---|---|---|
| 3,781,955 A | | 1/1974 | Lavrinenko et al. ........ 29/25.35 |
| 3,943,614 A | * | 3/1976 | Yoshikawa et al. ......... 264/435 |
| 4,322,877 A | * | 4/1982 | Taylor ........................ 29/25.35 |
| 4,330,730 A | | 5/1982 | Kurz et al. .................. 310/331 |
| 4,376,302 A | * | 3/1983 | Miller ......................... 310/358 |
| 4,469,978 A | | 9/1984 | Hamada et al. ............. 310/366 |
| 4,654,546 A | * | 3/1987 | Kirjavainen ................ 307/400 |
| 4,725,994 A | | 2/1988 | Kaneko et al. ............. 367/140 |
| 4,879,698 A | | 11/1989 | Langberg ................... 310/348 |
| 5,118,982 A | | 6/1992 | Inoue et al. ................ 310/366 |
| 5,153,859 A | | 10/1992 | Chatigny et al. ........... 367/140 |
| 5,440,194 A | * | 8/1995 | Beurrier ..................... 310/328 |
| 5,559,387 A | | 9/1996 | Beurrier ..................... 310/328 |
| 5,614,044 A | * | 3/1997 | Nagayama et al. ........... 156/89 |
| 6,208,065 B1 | * | 3/2001 | Ueyama ..................... 310/311 |
| 6,278,222 B1 | * | 8/2001 | Katsuragi et al. ...... 310/323.17 |

FOREIGN PATENT DOCUMENTS

| | | |
|---|---|---|
| JP | 57-18641 | 4/1982 |
| JP | 60-162488 | 8/1985 |
| JP | 63-2198 | 1/1988 |
| JP | 2-58839 | 12/1990 |
| JP | 11-112046 | 4/1999 |
| JP | 11-195819 | 7/1999 |
| JP | 11-266039 | 9/1999 |
| JP | 11-299273 | 10/1999 |
| JP | 2000-77737 | 3/2000 |
| JP | 2000-174352 | 6/2000 |
| JP | 2001037262 A * | 2/2001 |

* cited by examiner

Primary Examiner—Nestor Ramirez
Assistant Examiner—Julio C. Gonzalez
(74) Attorney, Agent, or Firm—Burns, Doane, Swecker & Mathis, LLP (57) ABSTRACT

A tube-shaped piezoelectric conversion element and a method of fabricating a tube-shaped piezoelectric conversion element are provided. The piezoelectric conversion element is formed either with two electroded piezoelectric sheet elements (two-layer type) rolled up in a tube-shaped member or with a single piezoelectric sheet element (single-layer type) electroded on two opposing surfaces and folded near its center and rolled up in a tube shaped member. A non-electrode surface portion without electrode material disposed thereon is provided on at least one electroded surface of at least one piezoelectric sheet element at an end of the piezoelectric sheet element in a direction intersecting a tube-axis direction. At lease one non-electrode surface portion may also be provided on a piezoelectric sheet element in a region encompassing the fold of single-layer type device. Short circuiting between electrode layers is thereby substantially avoided at ends of the piezoelectric sheet elements or in the fold region.

17 Claims, 8 Drawing Sheets

FIG. 10 CONVENTIONAL

FIG. 11(a) CONVENTIONAL

FIG. 11(b)

FIG. 12 CONVENTIONAL

FIG. 13 CONVENTIONAL

PIEZOELECTRIC CONVERSION ELEMENT HAVING AN ELECTRODED SURFACE WITH A NON-ELECTRODE SURFACE PORTION AT AN END THEREOF

This disclosure is based on application No. 00-0038993 filed in Japan on Feb. 17, 2000, the entire contents of which are hereby incorporated by reference.

BACKGROUND OF THE INVENTION

1) Field of the Invention

The present invention relates to piezoelectric devices and, more particularly, to a roll-type piezoelectric conversion element formed as a tube by rolling up at least one piezoelectric sheet element and to methods of making the same. The roll-type piezoelectric conversion element may be used, for example, as an actuator.

2) Brief Description of Related Art

Actuators using piezoelectric conversion elements are used to drive and position driven parts in cameras, measuring devices, and other precision machinery because they have high conversion efficiency for converting an applied electrical energy to a drive force, are compact and light weight, and are capable of generating large drive forces. Further, the drive force is readily controllable.

A drive source piezoelectric conversion element used as an actuator may be constructed by laminating a plurality of single piezoelectric elements. This arrangement increases as much as possible the displacement generated in the thickness direction of a single piezoelectric element.

However, piezoelectric conversion elements (also referred to as piezoelectric conversion devices) constructed by laminating a plurality of individual piezoelectric elements are expensive because they are typically manufactured through complex operations including a process to apply an electrode to the surface of the individual piezoelectric elements, a process for lamination and adhesion of the piezoelectric elements, and a process for connecting the wiring of the electrodes of the various layers.

For this reason, other piezoelectric conversion elements have been proposed. One type is a conventional roll-type piezoelectric conversion element formed by laminating two thin piezoelectric sheet elements having electrodes formed on their surfaces so as to form a laminate member which is then rolled in a hollow tube shape (hereinafter referred to as "two-layer type"). Another type is a conventional roll-type piezoelectric conversion element formed by folding a single thin piezoelectric sheet element having electrodes formed on the front surface and back surface so as to form a lamination which is then rolled into a hollow tube shape (hereinafter referred to as "single-layer type").

Figure 10:
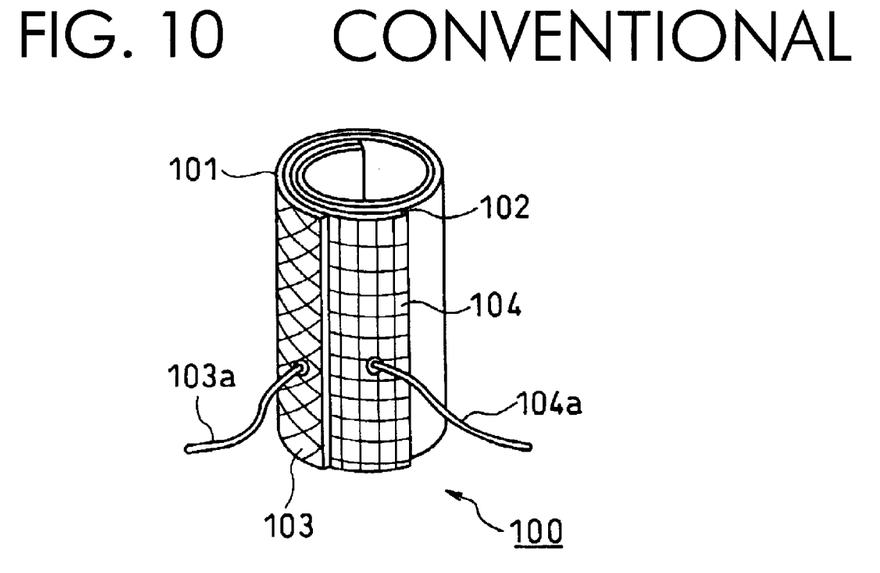
FIG. 10 is a perspective view showing an example of a structure of a conventional two-layer piezoelectric conversion element.
Figure 11A:
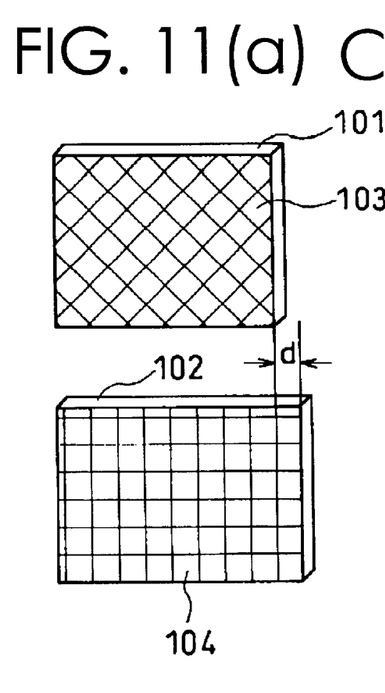
FIGS. 11(a) and 11(b) illustrate the electrode surface and lamination state of the two-layer piezoelectric conversion element of FIG. 10.
Figure 11B:
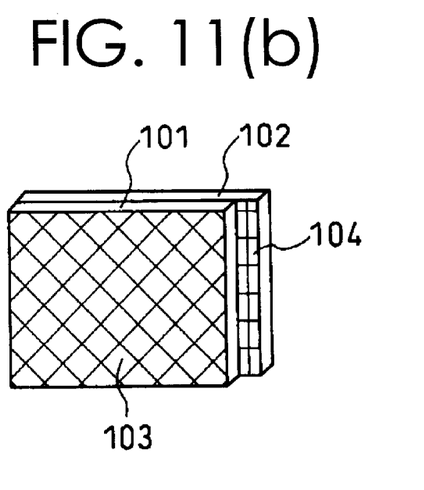

The conventional two-layer type piezoelectric conversion element is provided with an electrode on the entire front surface of each of the two layers of individual piezoelectric sheet elements. The two layers are laminated and rolled into a hollow tube shape. In order to apply a voltage to the electrodes, the two electrodes are exposed on the side surface of the piezoelectric sheet elements when forming the hollow tube shape by staggering the position of the rolled ends of the two individual piezoelectric sheet elements. Such a configuration is illustrated in FIG. 10, which shows a perspective view of an example of a conventional two-layer piezoelectric conversion element 100. FIGS. 11(a) and 11(b) illustrate the electrode surfaces and the lamination state of this element.

Figure 12:
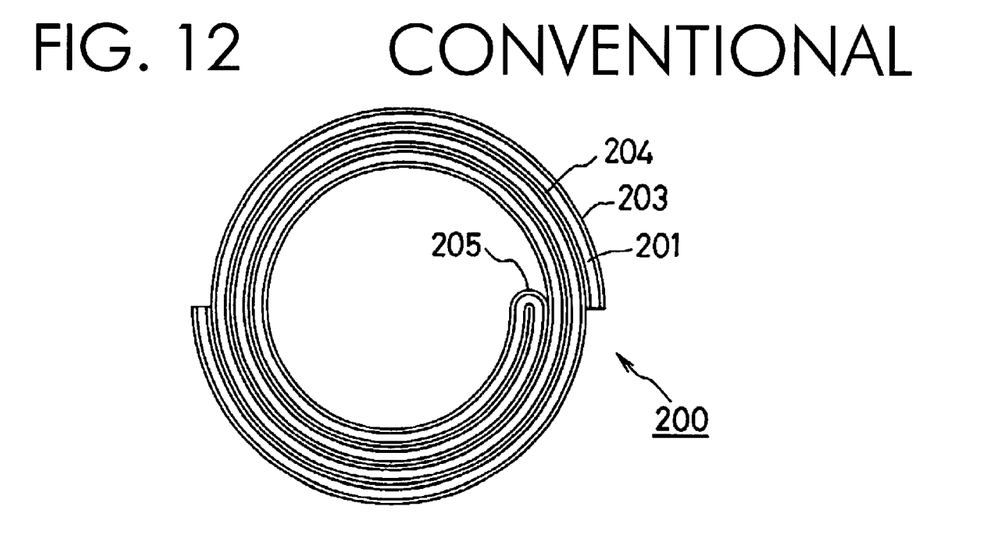
FIG. 12 is a section view showing an example of a structure of a conventional single-layer piezoelectric conversion element.
Figure 13:
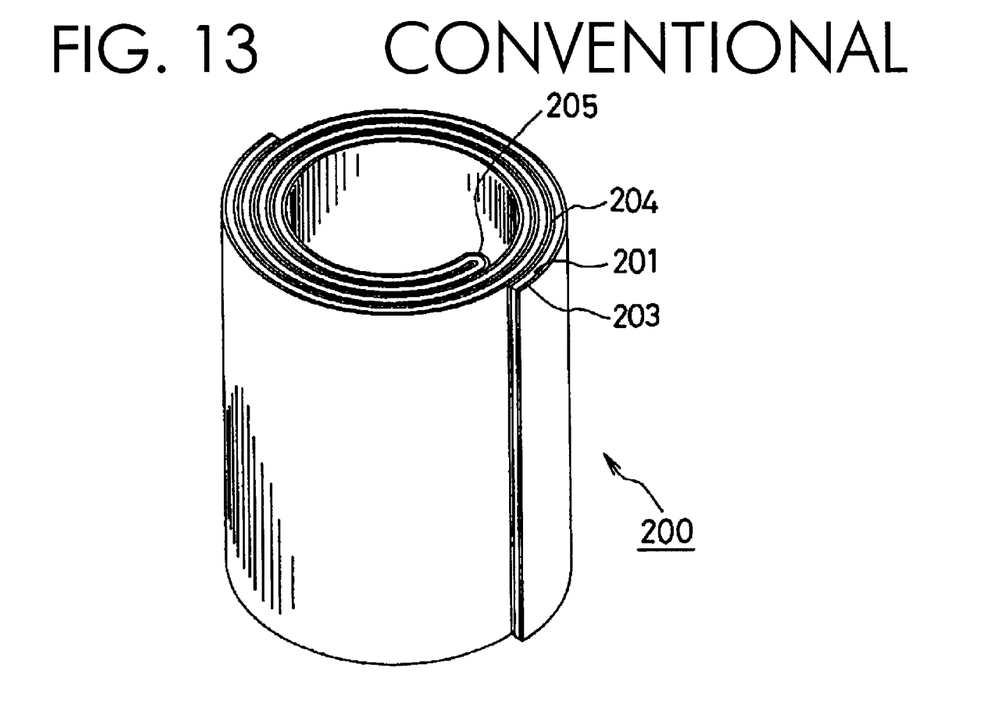
FIG. 13 is a perspective view of the single-layer piezoelectric conversion element of FIG. 12.

A conventional single-layer type piezoelectric conversion element, such as illustrated in FIGS. 12 and 13, is formed by folding approximately in half a single thin piezoelectric sheet element having electrodes formed on the front surface and the back surface, thereby creating a lamination. The folded part is shifted slightly to the right or left from the center part of the single layer element, such that both ends of the folded unit piezoelectric sheet element are shifted to expose the two electrodes on the side surface of the piezoelectric conversion element when formed in a hollow tube shape, thereby allowing leads to be readily connected to the electrodes.

The process for manufacturing the conventional two-layer type piezoelectric conversion element 100 is described below. First, a thin sheet-like material called a "green sheet" formed of piezoelectric ceramic material is cut to suitable dimensions to provide a first piezoelectric sheet element 101 and a second piezoelectric sheet element 102, as shown in FIG. 11(a). The length of the second piezoelectric sheet element 102 in the rolling direction is longer by a measure d than the first piezoelectric sheet element 101.

A first electrode 103 is formed on the surface of the first piezoelectric sheet element 101, and the back surface is designated a non-electrode surface. A second electrode 104 is formed on the surface of the second piezoelectric sheet element 102, and the back surface is designated a non-electrode surface (refer to FIG. 11a).

Then, the first piezoelectric sheet element 101 is arranged adjacent to the second piezoelectric sheet element 102 such that the non-electrode surface of the first piezoelectric sheet element 101 confronts the electrode surface of the second piezoelectric sheet element 102, forming a laminate body as shown in FIG. 11(b). This laminate body is rolled using a rolling shaft formed of cellulose or the like so as to form the tube-like shape shown in FIG. 10. Thereafter, the tube is calcined at a specific temperature, and subjected to a polarization process to complete the piezoelectric conversion element. Selecting the appropriate calcination temperature and polarizing conditions depends upon the particular piezoelectric material utilized and is within the purview of one of ordinary skill in the art. The rolling shaft is incinerated by the calcination process, leaving the interior of the tube hollow.

As shown in FIGS. 10 and 11(b), when the length of the first piezoelectric sheet element 101 is shorter than the length of the second piezoelectric sheet element 102 in the rolling direction, the ends of the first electrode 103 and the second electrode 104 can be staggered, and a lead 103a and a lead 104a can be easily connected to the respective electrode.

A conventional single-layer type piezoelectric conversion element is similar to the conventional two-layer type piezoelectric conversion element 100 described above. FIGS. 12 and 13 illustrate a conventional single-layer, roll-type piezoelectric conversion element 200 formed by folding in half a single-layer piezoelectric sheet element 201, which is then rolled up to form a hollow tube shape. FIG. 12 is a cross section view, and FIG. 13 is a perspective view. The construction of the conventional single-layer type piezoelectric conversion element 200 will now be described in more detail.

A piezoelectric sheet element 201 formed of a material called a "green sheet" having a thin sheet shape and formed of a piezoelectric ceramic material is cut to a suitable dimension. A first electrode 203 is formed on the front surface of the piezoelectric sheet element 201, and a second electrode 204 is formed on the back surface thereof. Then, the piezoelectric sheet element 201 is folded in half from a position 205 at the approximate center, forming a lamination as shown in FIGS. 12 and 13. This laminate body is rolled up in a tube shape in the same way as the previously described two-layer piezoelectric conversion element, calcinated at a specified temperature, and subjected to a polarization process to complete the piezoelectric conversion element.

A conventional tube-shaped two-layer type or single-layer type piezoelectric conversion element (100 or 200) of the aforesaid construction may suffer from short circuiting problems. As described above, a conventional piezoelectric conversion element (100 or 200) is formed by rolling up a laminate body into a tube shape, such that the piezoelectric conversion element (100 or 200) has many overlapping layers. This tube-shaped conversion element (100 or 200) is then calcinated at a specified temperature. During the calcination process, a difference in contraction occurs between the electrode and green sheet layers of the piezoelectric laminate body, causing peeling between layers of the laminate body due to this difference in contraction. This contraction often results in defects such as cracks in the piezoelectric sheet element, which can cause short circuiting between electrodes when these defects cross the layers of the electrically insulating piezoelectric sheet element.

Figure 4A:
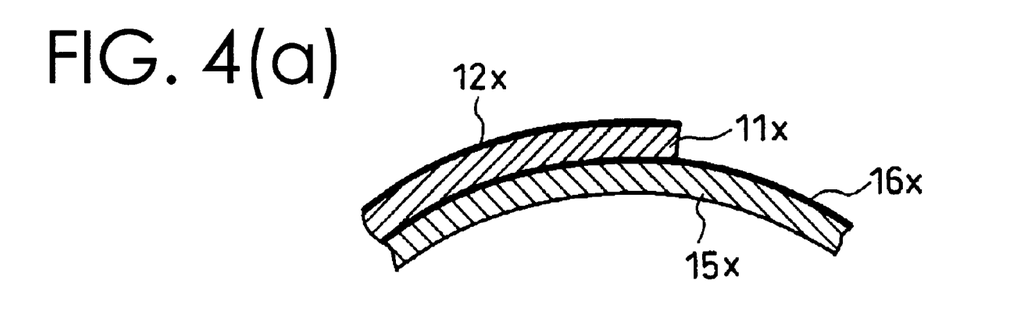
FIGS. 4(a)–4(c) are an enlarged section view showing the condition of the end a conventional piezoelectric conversion element in a direction (rolling direction) intersecting the tube-axis direction.
Figure 4B:
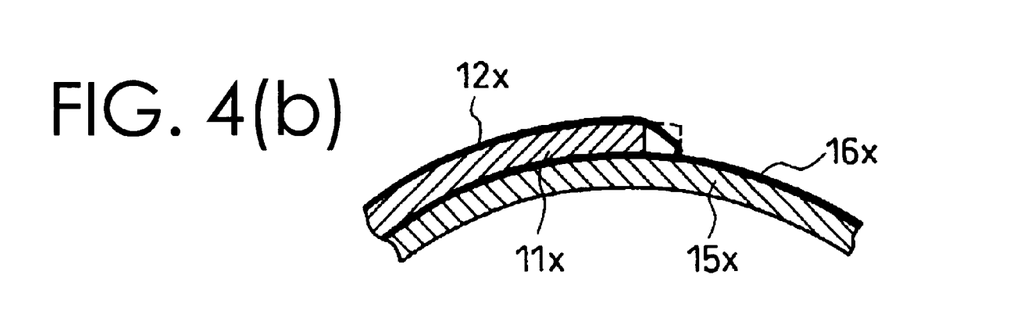

When the conditions of short circuiting between electrodes of conventional piezoelectric conversion elements were investigated, it was found that a large contraction of the piezoelectric sheet element (green sheet) occurred due to calcination, and that the remaining electrode at the end of the piezoelectric sheet element (green sheet) curved over the piezoelectric sheet element such that this remaining electrode contacted the electrode of the under layer, thereby creating a short circuit between electrodes. This situation is illustrated in FIG. 4(*b*) for a conventional piezoelectric conversion element wherein the end of electrode 12*x* curves over the end of the piezoelectric sheet element 11*x* after calcination, thereby contacting electrode 16*x*. Such short circuiting is detrimental to the operation of a piezoelectric device.

Accordingly, an object of the present invention is to provide a piezoelectric conversion element having excellent yield that does not suffer from short circuits between electrodes created by calcination of the piezoelectric sheet element. It is also an object of the present invention to provide a method of fabrication of a piezoelectric conversion element that has excellent yield and that does not suffer from such short circuiting.

SUMMARY

According to a first embodiment of the invention there is provided a piezoelectric conversion element having a tube shape comprising a piezoelectric sheet element and an electrode formed on a surface of the piezoelectric sheet element, the piezoelectric sheet element and the electrode being configured in the form of a rolled-up laminate. The surface of the piezoelectric sheet element includes a non-electrode surface portion without electrode material disposed thereon, the non-electrode surface portion being located at an end of the piezoelectric sheet element in a direction intersecting a tube-axis direction. The piezoelectric sheet element may comprise a ceramic piezoelectric material, and the ceramic material may be a PZT ceramic. In addition, the non-electrode surface portion may have a predetermined width approximately equal to a thickness of the piezoelectric sheet element. The thickness of the piezoelectric sheet element may be a thickness prior to a calcination process.

According to another embodiment of the invention, there is provided a piezoelectric conversion element having a tube shape comprising a first piezoelectric sheet element having an electroded surface and an opposing non-electroded surface disposed opposite the electroded surface of the first piezoelectric sheet element. The piezoelectric conversion element further comprises a second piezoelectric sheet element having an electroded surface and an opposing non-electroded surface disposed opposite the electroded surface of the second piezoelectric sheet element. The first piezoelectric sheet element and the second piezoelectric sheet element are configured in the form of a rolled-up laminate such that the non-electroded surface of the first piezoelectric sheet element and the electroded surface of the second piezoelectric sheet element confront each other. The electroded surface of the first piezoelectric sheet element includes a first non-electrode surface portion without electrode material disposed thereon, and the electroded surface of the second piezoelectric sheet element may include a second non-electrode surface portion without electrode material disposed thereon. The first non-electrode surface portion may be located at an end of the first piezoelectric sheet element in a direction intersecting the tube-axis direction, and the second non-electrode surface portion may be located at an end of the second piezoelectric sheet element in a direction intersecting the tube-axis direction. The electroded surface of the first piezoelectric sheet element may be arranged on a radially-outward-facing side of the first piezoelectric sheet element. In addition, the electroded surface of the first piezoelectric sheet element may include a third non-electrode surface portion without electrode material disposed thereon, and the electroded surface of the second piezoelectric sheet element may include a fourth non-electrode surface portion without electrode material disposed thereon, such that the third non-electrode surface portion is located at another end of the first piezoelectric sheet element in a direction intersecting the tube-shape axis direction and such that the fourth non-electrode surface portion is located at another end of the second piezoelectric sheet element in a direction intersecting the tube-axis direction. The first non-electrode surface portion may have a predetermined width approximately equal to a thickness of the first piezoelectric sheet element, and the second non-electrode surface portion may have a predetermined width approximately equal to a thickness of the second piezoelectric sheet element, wherein the thicknesses referred to may be thicknesses prior to a calcination process.

According to another embodiment of the present invention, there is provided piezoelectric conversion element having a tube shape, comprising a piezoelectric sheet element having a first electrode formed on a first surface thereof and having a second electrode formed on an opposing second surface thereof, the piezoelectric sheet element having a fold parallel to a tube-axis direction, the piezoelectric sheet element being configured in the form of a rolled-up laminate. The first surface of the piezoelectric sheet element includes a first non-electrode surface portion without electrode material disposed thereon, the first non-electrode surface portion being located at a first end of the piezoelectric sheet element in the direction intersecting the tube-axis direction. In addition, one of the first and second surfaces may include a second non-electrode surface portion without electrode material disposed thereon. The second non-electrode surface portion may be located on the first surface at a second end of the piezoelectric sheet element, the piezoelectric sheet element being configured such that the fold causes the second surface to confront itself. Alternatively, the second non-electrode surface portion may be located on the second surface at one of the first end and a second end of the piezoelectric sheet element, the piezoelectric sheet element being configured such that the fold causes the second surface to confront itself. The first and second non-electrode surface portions may have a predetermined width approximately equal to a thickness of the piezoelectric sheet element, and the thickness referred to may be the thickness prior to a calcination process. In addition, at least one of the first and second surfaces of the piezoelectric sheet element may be provided with a non-electrode surface portion without electrode material disposed thereon in a region encompassing the fold. Moreover, the fold may be displaced a distance from the center of the piezoelectric sheet element such that ends of the piezoelectric sheet element are displaced relative to one another in the direction intersecting the tube-axis direction.

According to another embodiment of the present invention, there is provided a method of fabricating a piezoelectric conversion element, comprising arranging a first piezoelectric sheet element adjacent to a second piezoelectric sheet element, the first piezoelectric sheet element having an electroded surface that includes a first electrode and having an opposing non-electroded surface, the second piezoelectric sheet element having an electroded surface that includes a second electrode and having an opposing non-electroded surface. The non-electroded surface of the first piezoelectric sheet element may confront the electroded surface of the second piezoelectric sheet element. The method further comprises rolling the first and second piezoelectric sheet elements around a shaft, the first and second piezoelectric sheet elements thereby forming a tube member having overlapping layers of the piezoelectric sheet elements with a tube-axis direction parallel to the shaft. The method further comprises calcinating the tube member at a temperature sufficient to bind the layers of the tube member together, the shaft being incinerated during the calcinating, wherein the electroded surface of the first piezoelectric sheet element includes a first non-electrode surface portion without electrode material disposed thereon, and wherein the electroded surface of the second piezoelectric sheet element may include a second non-electrode surface portion without electrode material disposed thereon. The first non-electrode surface portion may be located at an end of the first piezoelectric sheet element in a direction intersecting the tube-axis direction, and the second non-electrode surface portion may be located at an end of the second piezoelectric sheet element in a direction intersecting the tube-axis direction. The first non-electrode surface portion may have a predetermined width approximately equal to a thickness of the first sheet of piezoelectric material, and the thickness referred to may be the thickness prior to calcinating. The second non-electrode surface portion may have a predetermined width approximately equal to a thickness of the second sheet of piezoelectric material, and the thickness referred to may be the thickness prior to calcinating. In addition, the electroded surface of the first piezoelectric sheet element may include a third non-electrode surface portion without electrode material disposed thereon, and the electroded surface of the second piezoelectric sheet element may include a fourth non-electrode surface portion without electrode material disposed thereon, such that the third non-electrode surface portion is located at another end of the first piezoelectric sheet element in a direction intersecting the tube-axis direction and such that the fourth non-electrode surface portion is located at another end of the second piezoelectric sheet element in a direction intersecting the tube-axis direction.

According to another embodiment of the present invention, there is provided a method of fabricating a piezoelectric conversion element, comprising folding a piezoelectric sheet element having a first electrode formed on a first surface thereof and having a second electrode formed on an opposing second surface thereof such that a fold is produced in the piezoelectric sheet element. The method further comprises rolling the folded piezoelectric sheet element around a shaft, thereby forming a tube member having overlapping layers of the piezoelectric sheet element with a tube-axis direction parallel to the shaft, the fold being oriented parallel to the tube-axis direction. The method further comprises calcinating the tube member at a temperature sufficient to bind the layers of the tube member together, the shaft being incinerated during the calcinating. The first surface of the of the piezoelectric sheet element includes a first non-electrode surface portion without electrode material disposed thereon, the first non-electrode surface portion being located at a first end of the piezoelectric sheet element in a direction intersecting the tube-axis direction. In addition, one of the first and second surfaces may include a second non-electrode surface portion without electrode material disposed thereon. The second non-electrode surface portion may be located on the first surface at a second end of the piezoelectric sheet element, the piezoelectric sheet element being configured such that the fold causes the second surface to confront itself. Alternatively, the second non-electrode surface portion may be located on the second surface at one of the first end and a second end of the piezoelectric sheet element, the piezoelectric sheet element being configured such that the fold causes the second surface to confront itself. The first and second non-electrode surface portions may have a predetermined width approximately equal to a thickness of the piezoelectric sheet element, and the thickness referred to may be the thickness prior to calcinating. In addition, at least one of the first and second surfaces of the piezoelectric sheet element may be provided with a non-electrode surface portion without electrode material disposed thereon in a region encompassing the fold.

DETAILED DESCRIPTION

1) First Embodiment

Figure 1:
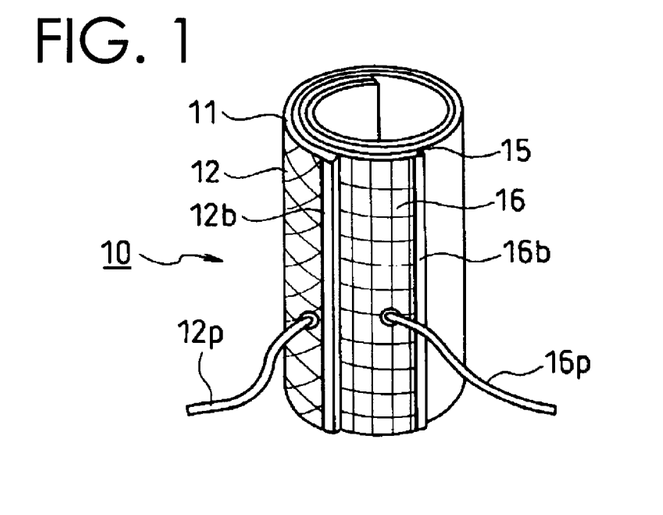
FIG. 1 is a perspective view showing the structure of a piezoelectric conversion element of a first embodiment.
Figure 2A:
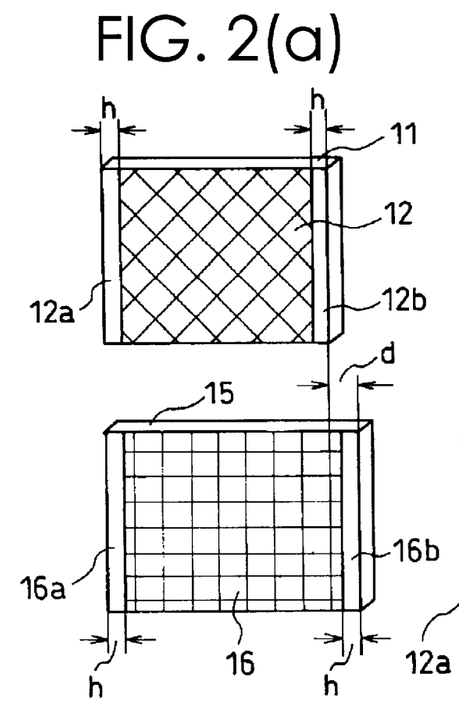
FIGS. 2(a) and 2(b) are a development view showing the electrode surface and the lamination condition of the piezoelectric conversion element of FIG. 1.
Figure 2B:
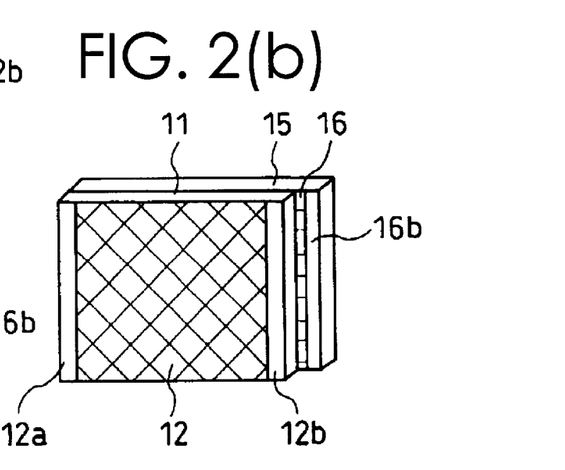

The first embodiment is a two-layer piezoelectric conversion element 10 such as illustrated in FIGS. 1, 2(a) and 2(b). FIG. 1 is a perspective view showing the structure of the piezoelectric conversion element 10. FIGS. 2(a) and 2(b) are development views showing the electrode surface and lamination state. In FIGS. 1 and 2, the dimension in the thickness direction of the first and second piezoelectric sheet elements and of the first and second electrodes and the like is exaggerated relative to the dimension in the length direction in order to show the laminate structure of the piezoelectric conversion element 10.

In FIGS. 1, 2(a) and 2(b), reference number 11 refers to a first piezoelectric sheet element, and reference number 12 refers to a first electrode formed on a first surface (front surface) of the first piezoelectric sheet element 11. Reference number 15 refers to a second piezoelectric sheet element, and reference number 16 refers to a second electrode formed on a first surface (front surface) of the second piezoelectric sheet element 15. Reference to the terms "front" and "back" herein is merely for convenience and is not intended to be restrictive.

The process for manufacturing the piezoelectric conversion element 10 is described below. First, a piezoelectric ceramic such as a PZT ceramic having a main component of PZT ($PbZrO_3 \times PbTiO_3$) is used as the material to form the first and second piezoelectric sheet elements 11 and 15. This ceramic powder is mixed with solvent, dispersant, binder, and plasticizer, and spread to form a uniformly flat layer of fixed thickness, e.g., 50 $\mu$m, using a blade or the like. Selection of the appropriate solvent, dispersant, binder, and plasticizer is within the purview of one of ordinary skill in the art. The solvent is evaporated and the material dried to obtain a flexible sheet called a "green sheet" (also referred to as "PZT green sheet").

As shown in FIG. 2(a), the PZT green sheet is cut to a specific size to form the first and second piezoelectric sheet elements 11 and 15, and a paste-like electrode material, e.g., a paste-like electrode material comprising a platinum (Pt) electrode material in a suitable resin binder, is applied to the first surface (front surface) of the respective piezoelectric sheet elements, heated to 100° C. in an oven for approximately 20 minutes to dry, to form the first electrode 12 and the second electrode 16. The first surface of the respective piezoelectric sheet elements 11 and 15 that receives the electrode material may also be referred to as an electroded surface. Selection of a suitable paste-like electrode material is within the purview of one of ordinary skill in the art. Further, those of ordinary skill in the art will recognize that the electrodes could also be formed by other suitable methods, such as bonding a metallic film to the piezoelectric sheet elements with an adhesive.

As illustrated in FIGS. 2(a) and 2(b), when forming the first electrode 12 on the first piezoelectric sheet element 11, non-electrode surface portions 12a and 12b having a specific width h are provided on the electroded surface of the piezoelectric sheet element 11 by not applying the electrode material to the ends of the first piezoelectric sheet element 11 in a direction (rolling direction) intersecting the tube-axis direction. Similarly when forming the second electrode 16 on the second piezoelectric sheet element 15, non-electrode surface portions 16a and 16b having a specific width h are formed by not applying the electrode material to the ends in a direction (rolling direction) intersecting the tube-axis direction. Further, as shown in FIG. 2(b), the second electrode 16 surface (front surface) of the second piezoelectric sheet element 15 is positioned to confront the non-electrode surface (back surface) of the first piezoelectric sheet element 11, forming a laminate body. The laminate body is then rolled up so as to have the first electrode 12 surface (front surface) of the first piezoelectric sheet element 11 on the exterior side, thereby forming a tube member such as shown in FIG. 1.

The first electrode 12 and the second electrode 16 can be exposed on the surface of the final tube-shaped piezoelectric conversion element 10 by making the length of the second piezoelectric sheet element 15 in the rolling direction longer by a measure d than the first piezoelectric sheet element 11.

The rolled-up tube member is then calcinated under a specific temperature condition, e.g., 1250° C. The appropriate temperature depends upon the particular ceramic material as noted previously. After calcination, the rolled-up tube member may then be polarized by applying a voltage between the electrodes, as known by those skilled in the art, to complete the piezoelectric conversion element 10.

The method for mounting the lead wires may be a solder mounting or conductive paste mounting to connect the lead wires 12p and 16p to the first electrode (e.g., positive electrode) 12 of the first piezoelectric sheet element 11 and the second electrode (e.g., negative electrode) 16 of the second piezoelectric sheet element 15, respectively.

Figure 3A:
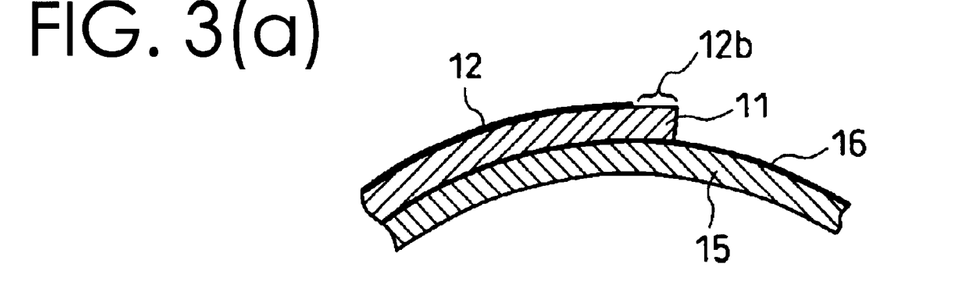
FIGS. 3(a)–3(c) are an enlarged section view showing the condition of the end the piezoelectric conversion element of FIG. 1 in a direction (rolling direction) intersecting the tube-axis direction.
Figure 3B:
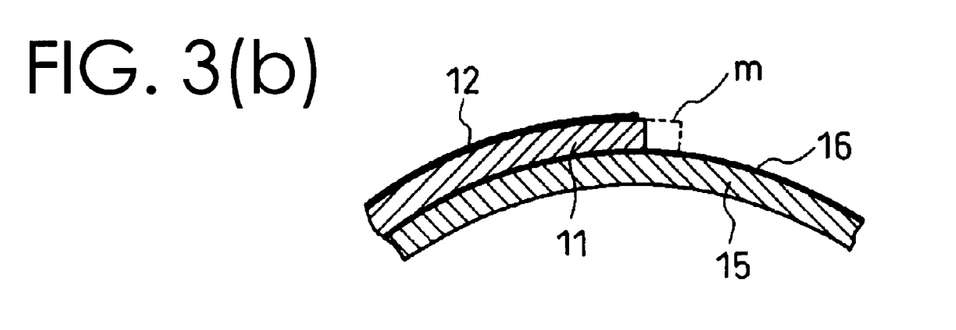

FIGS. 3(a) and 3(b) are enlarged section views showing the condition of the end of the first piezoelectric sheet element 11 in a direction (rolling direction) intersecting the tube-axis direction when the tube is formed by rolling up a laminate body comprising the first and second piezoelectric sheet elements 11 and 15 such that the second electrode 16 surface (front surface) of the second piezoelectric sheet element 15 confronts the non-electroded surface (back surface) of the first piezoelectric sheet element 11. FIG. 3(a) shows the condition before calcination, and FIG. 3(b) shows the condition after calcination.

The condition of the end of the second piezoelectric sheet element 15 in a direction (rolling direction) intersecting the tube-axis direction is the same as that illustrated in FIGS. 3(a) and 3(b) for the first piezoelectric sheet element 11. Thus, a separate description of the condition of the electrode ends for the second piezoelectric sheet element 15 is not necessary.

The PZT green sheet (piezoelectric sheet element 11) used to form the piezoelectric conversion element 10 undergoes contraction as sintering progresses by calcination. The contraction rate of PZT green sheet (piezoelectric sheet element 11) is typically more than double that of the electrode material, which is typically, but not limited to, platinum (Pt), silver palladium, nickel or the like. Accordingly, when the piezoelectric sheet element 11 is contracted by calcination, the electrode 12 formed on the surface thereof shifts relative to the piezoelectric sheet element 11 as illustrated in FIGS. 3(a) and 3(b).

More particularly, in the present embodiment of the invention, non-electrode surface portions 12a and 12b of specific width h are provided at the end of the first piezoelectric sheet element 11 in a direction intersecting the tube-axis direction of the piezoelectric sheet element (i.e., at the end in the rolling direction), as shown FIGS. 2(a) and 2(b). The non-electrode surface portion 12b is further shown in FIG. 3(a). In this way even though the end of the first piezoelectric sheet element 11 contracts due to calcination as indicated by the dashed line m in FIG. 3(b), the first electrode 12 formed on the surface thereof does not separate and protrude from the end of the contracted first piezoelectric sheet element 11, such that there is no concern of short circuiting due to direct contact of the first electrode 12 and the second electrode 16.

Figure 3C:
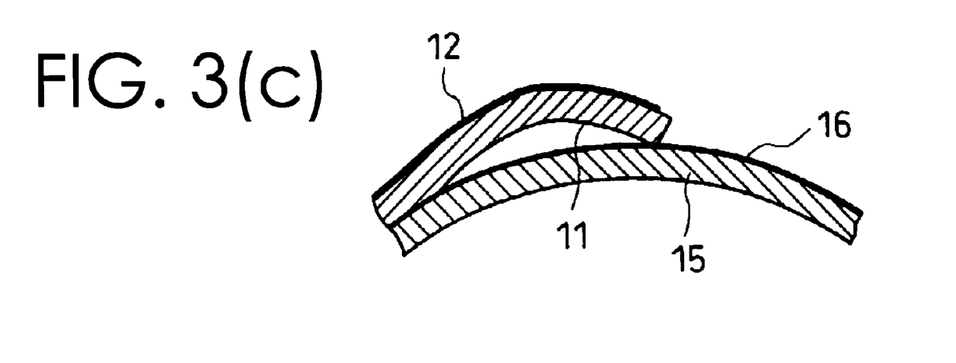

FIG. 3(c) illustrates a potential situation wherein the end of the top layer piezoelectric sheet element 11 is raised from the surface of the bottom layer second piezoelectric sheet element 15 after calcination such that there is a bending curvature of the piezoelectric sheet element 11 near the end due to uneven rolling tightness when forming the tube member with the laminate body. In this instance there is also no concern of short circuiting due to direct contact of the first electrode 12 and the second electrode 16 because the non-electrode surface portion 12b of a specific width h is provided on the piezoelectric sheet element 11 at the end (end in the rolling direction) of the first electrode 12 formed on the first piezoelectric sheet element 11.

In contrast to the end condition of the piezoelectric sheet element 11 in the present invention as described above, FIGS. 4(a) and 4(b) are enlarged section views showing the end condition of a conventional piezoelectric sheet element 11x and electrode 12x without a non-electrode surface portion formed at the end (end in the rolling direction) of the electrode 12x formed on the first piezoelectric sheet element 11x. FIG. 4(a) shows the condition before calcination, and FIG. 4(b) shows the condition after calcination.

In this conventional case, FIG. 4(b) shows that when the first piezoelectric sheet element 11x contracts through calcination, the electrode 12x formed on the surface thereof separates and projects from the end of the contracted first piezoelectric sheet element 11x. The electrode 12x short circuits by contacting the electrode 16x of the bottom layer second piezoelectric sheet element 15x due to curvature generated by the calcination as shown in FIG. 4(b).

Figure 4C:
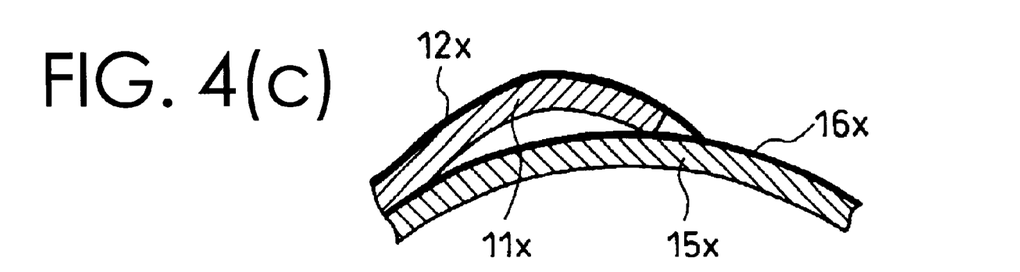

FIG. 4(c) illustrates a situation for a conventional piezoelectric sheet element 11x wherein a portion of the top layer piezoelectric sheet element 11x is raised from the surface of the bottom layer second piezoelectric sheet element 15x after calcination such that there is a bending curvature of this portion. This effect is caused by uneven rolling tightness when forming the tube shape with the laminate body comprising the two piezoelectric sheet elements 11x and 15x having electrodes 12x and 16x formed on their surfaces. In this instance short circuiting also occurs due to direct contact of the electrode 12x and the electrode 16x of the bottom layer piezoelectric sheet element 15 due to the curvature caused by calcination because the electrode 12x formed on the first piezoelectric sheet element 11x separates and protrudes from the end of the contracted first piezoelectric sheet element 11x. Those skilled in the art will recognize that the piezoelectric conversion element of the present invention, such as illustrated in FIGS. 1–3, can avoid the short circuiting of conventional devices illustrated in FIGS. 4(b) and 4(c).

For the piezoelectric conversion element of the present invention, such as illustrated in development view in FIGS. 2(a) and 2(b), the width h of the non-electrode surface portions 12a and 12b may be approximately the same as the thickness of the PZT green sheet before calcination. For example, the width h may be approximately 30–50 microns.

In the first embodiment of the piezoelectric conversion element of the present invention such as illustrated in FIGS. 1, 2(a), 2(b) and 3(a)–3(c), non-electrode surface portions 12a and 12b and non-electrode surface portions 16a and 16b of specified width h are formed on the respective piezoelectric sheet elements (11 and 15) at the ends (end in the rolling direction) of the electrodes 12 and 16 in a direction intersecting the tube-axis direction of the piezoelectric sheet element. In this way short circuit events of the electrodes at the ends of the piezoelectric sheet elements after calcination can be reduced to less than 5% occurrence rather than the 15–30% occurrence of the conventional structure shown in FIGS. 4(a)–4(c).

2) Second Embodiment

Figure 7:
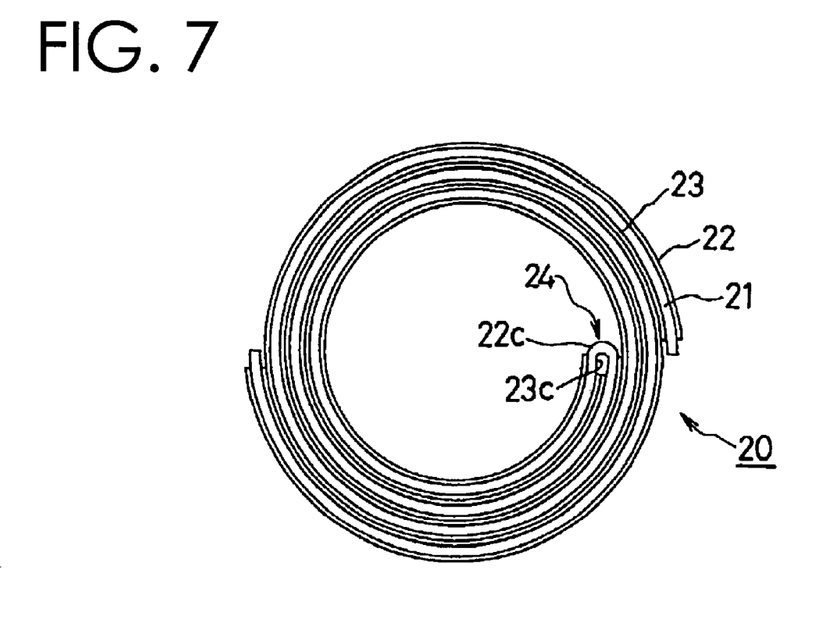
FIG. 7 is a section view of the piezoelectric conversion element of FIG. 5 rolled up in a tube shape.

The piezoelectric conversion element 20 of the second embodiment, such as illustrated in FIG. 7, is an element produced by forming electrodes on the front and back surfaces of a single piezoelectric sheet element (i.e., a first electrode on a first surface (front surface) and a second electrode on a second surface (back surface)), folding this piezoelectric sheet element in half into a laminate body, rolling up the laminate body into a tube member, and calcinating the tube member at a specific temperature.

Figure 5:
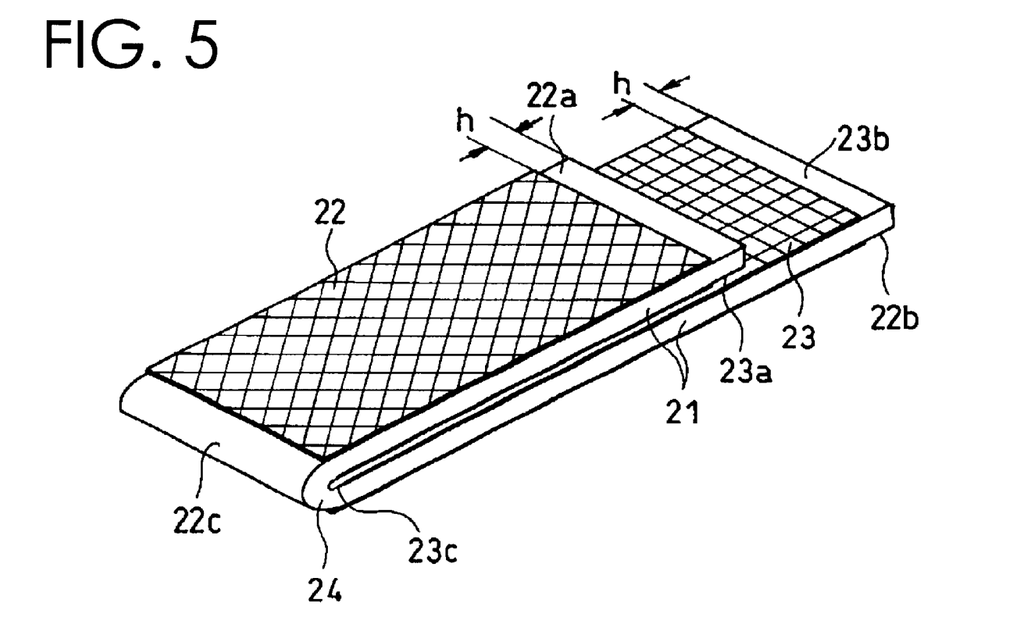
FIG. 5 is a perspective view showing the structure of the electrodes on the front surface and back surface before rolling up in a tube shape the piezoelectric conversion element of the second embodiment.
Figure 6:
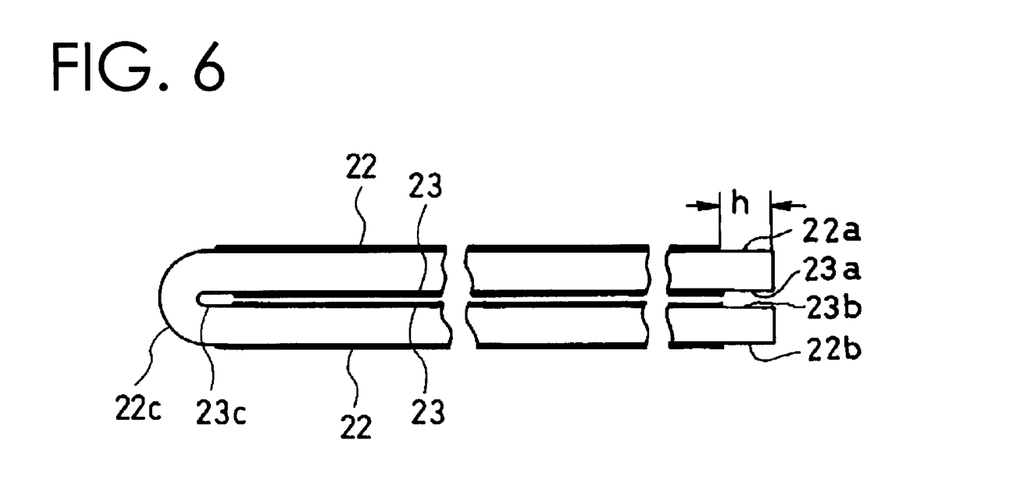
FIG. 6 is a section view showing the electrode structure of the folded part of the piezoelectric conversion element of FIG. 5.

FIG. 5 is a perspective view showing the electrode structure on the front surface and back surface of the piezoelectric sheet element 21 before the piezoelectric sheet element 21 is rolled up. FIG. 6 is a section view showing the electrode structure of the folded part of the piezoelectric sheet element. FIG. 7 is a section view of the piezoelectric sheet element 21 rolled up in a tube shape. In FIGS. 5 through 7 the dimension in the thickness direction of the first and second piezoelectric sheet elements and the first and second electrodes and the like is exaggerated relative to the dimension in the length direction in order to show the laminate structure of the piezoelectric conversion element 20.

In FIGS. 5 and 6, reference number 21 refers to a piezoelectric sheet element, reference number 22 refers to a first electrode formed on a first surface (exterior side surface) of the piezoelectric sheet element 21, and reference number 23 refers to a second electrode formed on a second surface (interior side surface) of the piezoelectric sheet element 21. Non-electrode surface portions 22a, 22b, 23a and 23b having a specific width h are formed on the piezoelectric sheet element 21 at the ends of the first electrode and second electrode in a direction intersecting the tube-axis direction in a manner like that discussed for the first embodiment. That is, as shown in FIG. 6, non-electrode surface portions 22a and 22b are formed at the ends of the first electrode 22 formed on the first surface (exterior side surface) of the piezoelectric sheet element 21, and non-electrode surface portions 23a and 23b are formed at the ends of the second electrode 23 formed on the second surface (interior side surface) of the piezoelectric sheet element 21.

In addition, non-electrode surface portions 22c and 23c may be formed in the region of the fold 24 of the piezoelectric sheet element 21. This is done to avoid or at least reduce short circuiting of the first electrode 22 and second electrode 23 formed on the front and back surfaces of the piezoelectric sheet element 21 in the region of the fold 24. Providing such non-electrode surface portions 22c and 23c in the region of the fold 24 is beneficial because the fold is thinner than other regions, suffers severe distortion, and often cracks during calcination.

Figure 8:
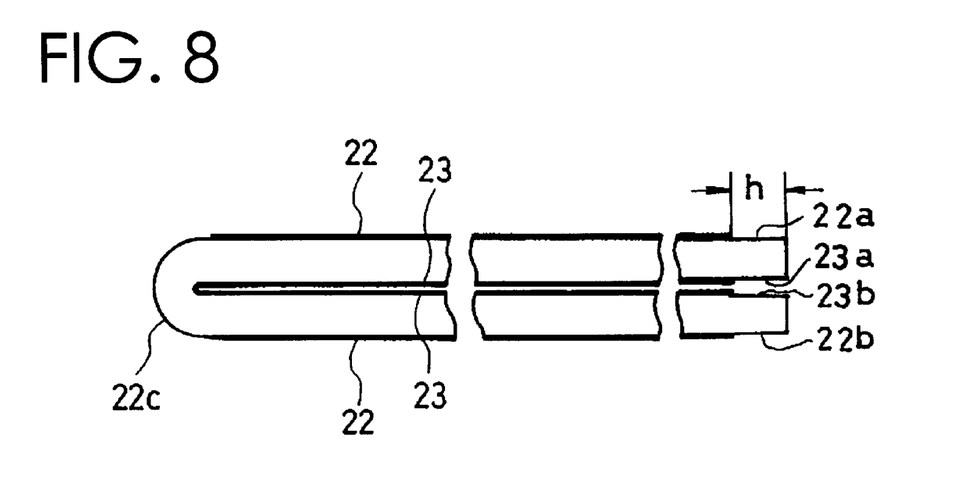
FIG. 8 is a section view showing the electrode structure of the non-electrode surface portion only on one surface of the folded part of the piezoelectric conversion element.

Short circuiting between electrodes 22 and 23 at the fold 24 can be effectively prevented even when a non-electrode surface portion is provided only at either the first electrode 22 side (exterior side surface) or at the second electrode 23 side (interior side surface). FIG. 8 shows an example of a non-electrode surface portion 22c provided at only the first electrode side (exterior side surface) of the folded part 24, without a non-electrode surface portion provided at the second electrode 23 side (interior side surface).

As illustrated in FIG. 5, the piezoelectric sheet element 21 having electrodes 22 and 23 formed on front and back surfaces is folded at the approximate center of the piezoelectric sheet element 21 to form the laminate body. The laminate body is rolled up in a tube shape, such as shown in FIG. 7.

When the piezoelectric sheet element 21 is folded to form the laminate body, the fold 24 may be shifted slightly to right or left from the center of the element so as to stagger the bilateral ends of the folded piezoelectric sheet element 21 as illustrated in FIG. 5, thereby providing for exposure of the first electrode 22 and the second electrode 23 for easy connection of lead wires to the electrodes 22 and 23 when the piezoelectric conversion element 20 is in final tube form.

Then, the rolled up tube member is calcinated under specific temperature condition, e.g., 1250° C., and polarized by applying a voltage between the electrodes to complete the piezoelectric conversion element 20.

The method for mounting the lead wires may be solder mounting or conductive paste mounting to connect the lead wires 22a and 23b to the first electrode (positive electrode) first electrode 22 and the second electrode 23 exposed on the exterior side of the piezoelectric conversion element 20.

Other details of the manufacturing process pertaining to the piezoelectric material, the electrode material, the electrode formation, formation of the tube, calcination, and polarization are identical to that of the piezoelectric conversion element 10 of the first embodiment. Detailed description of these are, therefore, omitted.

Figure 9A:
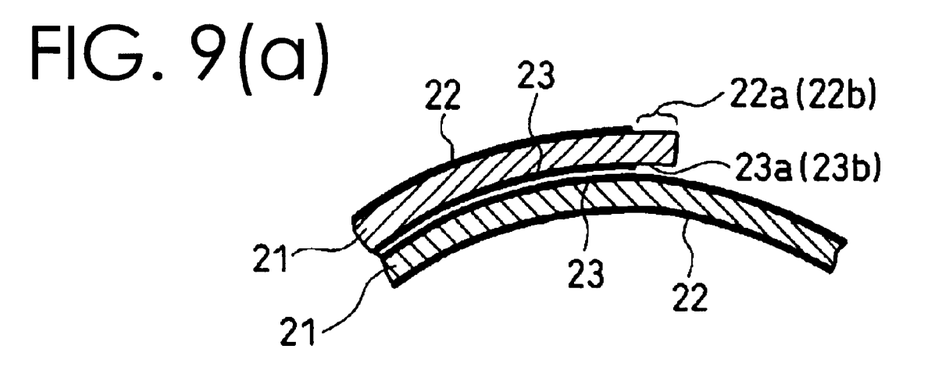
FIGS. 9(a)–9(c) are an enlarged section view showing the condition of the end of the piezoelectric conversion element of FIG. 5 in a direction (rolling direction) intersecting the tube-axis direction.
Figure 9B:
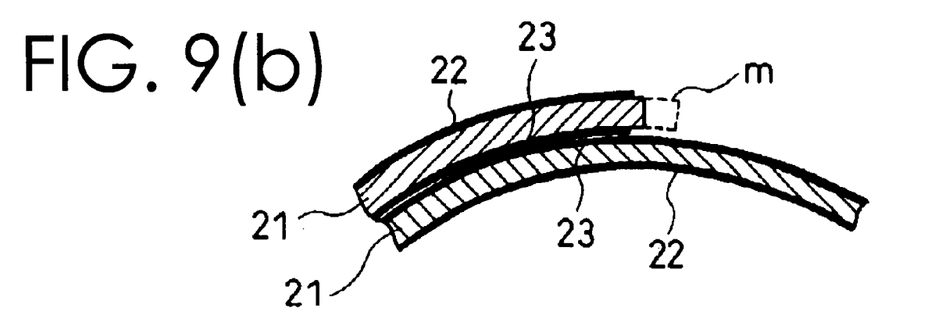
Figure 9C:
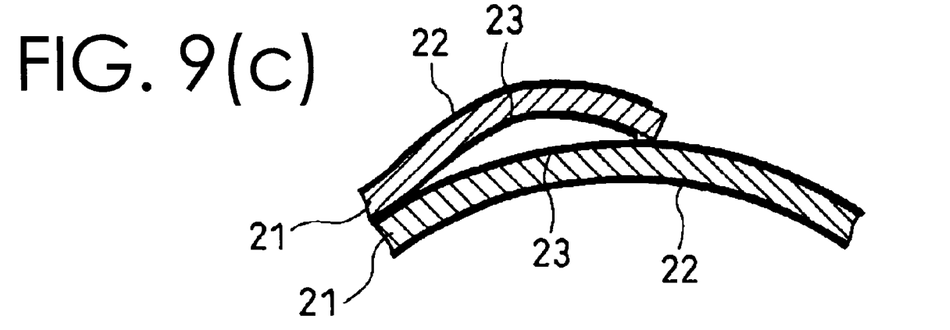

FIGS. 9(a)–9(c) are an enlarged section view showing the end condition of the piezoelectric conversion element 20 in a direction (rolling direction) intersecting the tube-axis direction. FIG. 9(a) shows the condition before calcination, and FIG. 9(b) shows the condition after calcination.

The end condition of the piezoelectric conversion element 20 illustrated in FIGS. 9(a) and 9(b) is similar to that of the first embodiment illustrated in FIGS. 3(a) and 3(b). As illustrated in FIGS. 8 and 9(a), the non-electrode surface portions 22a and 22b are formed at the end of the first electrode 22 formed on the first surface (exterior side surface) of the piezoelectric sheet element 21, and the non-electrode surface portions 23a and 23b are formed at the end of the second electrode 23 formed on the second surface (interior side surface) of the piezoelectric sheet element 21. The first electrode 22 formed on the exterior surface side and the second electrode 23 formed on the interior surface side do not separate and protrude from the end of the contracted piezoelectric sheet element 21, even when the end of the piezoelectric sheet element 21 is contracted as indicated by the dashed line m in FIG. 9(b). Accordingly, there is little concern of short circuiting through direct contact of the electrodes 22 and 23.

FIG. 9(c) illustrates a potential situation wherein a portion of the top layer piezoelectric sheet element 21 is raised from the surface of the bottom layer piezoelectric sheet element 21 after calcination such that there is a bending curvature near the end of the piezoelectric sheet element 21 due to uneven rolling tightness when forming the tube shape with the laminate body comprising piezoelectric sheet element 21 with electrodes 22 and 23 formed thereon. In this instance also there is little concern of short circuiting due to direct contact of the first electrode 22 and the second electrode 23 because including the non-electrode surface portions 22a and 23a of width h at the ends (in the rolling direction) of the first electrode 22 and the second electrode 23 effectively prevents such short circuiting, in contrast to the situation for conventional devices as illustrated in FIGS. 4(a)–4(c).

In the piezoelectric conversion element 20 of the second embodiment, the insulating piezoelectric conversion element 21 rarely cracked away from the fold when a voltage was applied during polarization. However, the region near the fold was somewhat more likely to crack. The reason for this is thought to be that the thickness of the piezoelectric sheet element at the fold is thinner than elsewhere when forming the tube shape by folding the piezoelectric sheet element 21 in lamination.

In the second embodiment, since the non-electrode surface portions 22b and 23b may be formed at the ends of both electrodes 22 and 23 near the fold 24 of the piezoelectric sheet element 21 as described above, the frequency of occurrence of short circuit events between electrodes 22 and 23 at the ends of these electrodes after calcination is substantially similar to that of the first embodiment.

The frequency of occurrence of short circuit events in the first and second embodiments of the present invention is less than that for conventional devices because, as noted previously, non-electrode surface portions having a specific width are provided at ends of the electrodes formed on the surfaces of the piezoelectric sheet element(s) in a direction intersecting the tube-shape axis direction. As a result, short circuiting is substantially reduced between electrodes even when differences in contraction are generated between the layers of the piezoelectric laminate body during calcination. Even when this contraction causes peeling between layers of the laminate body, resulting in defects such as separation of the electrode from the surface of the piezoelectric sheet element, production of piezoelectric conversion elements as described herein produces excellent yield of devices without short-circuiting defects.

The first and second embodiments of the roll-type piezoelectric conversion element according to the present invention have been described as having multiple nonelectrode surface portions located on various surfaces at ends of the piezoelectric sheet element(s). However, it is believed that benefits (e.g., less short circuiting events) may be obtained compared to conventional piezoelectric devices even if fewer non-electrode surface portions than those described above are provided. For example, benefits are expected even if only one such non-electrode surface portion is provided.

The invention has been described with reference to particular embodiments. However, it will be readily apparent to those skilled in the art that it is possible to embody the invention in specific forms other than those of the preferred embodiments described above. This may be done without departing from the spirit of the invention. The preferred embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A piezoelectric conversion element having a tube shape, comprising:
    a piezoelectric sheet element; and
    an electrode formed on a surface of the piezoelectric sheet element, the piezoelectric sheet element having a fold parallel to a tube-axis direction, the piezoelectric sheet element and the electrode being configured in the form of a rolled-up laminate,
    wherein the surface of the piezoelectric sheet element includes a non-electrode surface portion without electrode material disposed thereon, the non-electrode surface portion being located at the fold and extending along an entire length of the fold.

2. The piezoelectric conversion element of claim 1, wherein the piezoelectric sheet element comprises a ceramic piezoelectric material.

3. The piezoelectric conversion element of claim 2, wherein the ceramic piezoelectric material is a PZT ceramic.

4. A piezoelectric conversion element having a tube shape, comprising
    a piezoelectric sheet element having a first electrode formed on a first surface thereof and having a second electrode formed on an opposing second surface thereof, the piezoelectric sheet element having a fold parallel to a tube-axis direction, the piezoelectric sheet element being configured in the form of a rolled-up laminate,
    wherein the first surface of the piezoelectric sheet element includes a non-electrode surface portion without electrode material disposed thereon, the non-electrode surface portion of the first surface being located at the fold and extending along an entire length of the fold.

5. The piezoelectric conversion element of claim 4, wherein the second surface of the piezoelectric sheet element includes a non-electrode surface portion without electrode material disposed thereon, the non-electrode surface portion of the second surface being located at the fold and extending along an entire length of the fold.

6. The piezoelectric conversion element of claim 4, wherein the piezoelectric sheet element is configured such that the fold causes the second surface to confront itself.

7. The piezoelectric conversion element of claim 4, wherein the fold is displaced a distance from a center of the piezoelectric sheet element such that ends of the piezoelectric sheet element are displaced relative to one another in a circumferential direction.

8. A piezoelectric conversion element having a tube shape, comprising:
    a first piezoelectric sheet element having an electroded surface and an opposing non-electroded surface disposed opposite the electroded surface of the first piezoelectric sheet element; and
    a second piezoelectric sheet element having an electroded surface and an opposing non-electroded surface disposed opposite the electroded surface of the second piezoelectric sheet element,
    wherein the first piezoelectric sheet element and the second piezoelectric sheet element are configured in the form of a rolled-up laminate such that the non-electroded surface of the first piezoelectric sheet element and the electroded surface of the second piezoelectric sheet element confront each other,
    wherein the electroded surface of the first piezoelectric sheet element includes a first non-electrode surface portion without electrode material disposed thereon and wherein the electroded surface of the second piezoelectric sheet element includes a second non-electrode surface portion without electrode material disposed thereon,
    wherein
        the first non-electrode surface portion is located at an end of the first piezoelectric sheet element,
        the second non-electrode surface portion is located at an end of the second piezoelectric sheet element,
        the piezoelectric conversion element has a length along the tube-axis direction,
        the first non-electrode surface portion spans the length of the piezoelectric conversion element, and
        the second non-electrode surface portion spans the length of the piezoelectric conversion element.

9. The piezoelectric conversion element of claim 8, wherein the electroded surface of the first piezoelectric sheet element includes a third non-electrode surface portion without electrode material disposed thereon and wherein the electroded surface of the second piezoelectric sheet element includes a fourth non-electrode surface portion without electrode material disposed thereon,
    wherein
        the third non-electrode surface portion is located at another end of the first piezoelectric sheet element,
        the fourth non-electrode surface portion is located at another end of the second piezoelectric sheet element,
        the third non-electrode surface portion spans the length of the piezoelectric conversion element, and
        the fourth non-electrode surface portion spans the length of the piezoelectric conversion element.

10. The piezoelectric conversion element of claim 8, wherein the electroded surface of the first piezoelectric sheet element is arranged on a radially-outward-facing side of the first piezoelectric sheet element.

11. The piezoelectric conversion element of claim 8, wherein the electroded surface of the first piezoelectric sheet element includes a third non-electrode surface portion without electrode material disposed thereon and wherein the electroded surface of the second piezoelectric sheet element includes a fourth non-electrode surface portion without electrode material disposed thereon,
    wherein the third non-electrode surface portion is located at another end of the first piezoelectric sheet element, and
    wherein the fourth non-electrode surface portion is located at another end of the second piezoelectric sheet element.

12. The piezoelectric conversion element of claim 8, wherein the first non-electrode surface portion has a predetermined width approximately equal to a thickness of the first piezoelectric sheet element, and wherein the second non-electrode surface portion has a predetermined width approximately equal to a thickness of the second piezoelectric sheet element.

13. The piezoelectric conversion element of claim 11, wherein the third non-electrode surface portion has a predetermined width approximately equal to a thickness of the first piezoelectric sheet element, and wherein the fourth non-electrode surface portion has a predetermined width approximately equal to a thickness of the second piezoelectric sheet element.

14. The piezoelectric conversion element of claim 12, wherein the thicknesses of the first and second piezoelectric sheet elements refer to thicknesses prior to a calcination process.

15. A piezoelectric conversion element having a tube shape, comprising:

a piezoelectric sheet element; and an electrode formed on a surface of the piezoelectric sheet element, the piezoelectric sheet element having a fold parallel to a tube-axis direction, the piezoelectric sheet element and the electrode being configured in the form of a rolled-up laminate, wherein the surface of the piezoelectric sheet element includes a non-electrode surface portion without electrode material disposed thereon, the non-electrode surface portion being located at a region encompassing the fold, wherein the piezoelectric conversion element has a length along a tube-axis direction and wherein the non-electrode surface portion spans the length of the piezoelectric conversion element.

16. A piezoelectric conversion element having a tube shape, comprising:

a piezoelectric sheet element having a first electrode formed on a first surface thereof and having a second electrode formed on an opposing second surface thereof, the piezoelectric sheet element having a fold parallel to a tube-axis direction, the piezoelectric sheet element being configured in the form of a rolled-up laminate, wherein the piezoelectric conversion element has a length along the tube-axis direction, the first surface of the piezoelectric sheet element includes a non-electrode surface portion without electrode material disposed thereon, the non-electrode surface portion of the first surface being located at a region encompassing the fold, the non-electrode surface portion of the first surface spans the length of the piezoelectric conversion element, and one of the first and second surfaces includes another non-electrode surface portion without electrode material disposed thereon that spans the length of the piezoelectric conversion element.

17. The piezoelectric conversion element of claim 16, wherein the fold is displaced a distance from a center of the piezoelectric sheet element such that ends of the piezoelectric sheet element are displaced relative to one another in a circumferential direction.

* * * * *